United States Patent [19]

Giapis et al.

[11] Patent Number: 5,002,631
[45] Date of Patent: Mar. 26, 1991

[54] PLASMA ETCHING APPARATUS AND METHOD

[75] Inventors: Konstantinos P. Giapis; Richard A. Gottscho, both of Maplewood, N.J.; Geoffrey R. Scheller, Allentown, Pa.

[73] Assignee: AT&T Bell Laboratories, Murray Hill, N.J.

[21] Appl. No.: 494,999

[22] Filed: Mar. 9, 1990

[51] Int. Cl.⁵ .................... H01L 21/306; B44C 1/22; C03C 15/00; C03C 25/06

[52] U.S. Cl. .................... 156/643; 156/626; 156/646; 156/662; 156/345; 204/192.33; 204/298.32

[58] Field of Search ............... 156/626, 643, 646, 662, 156/345; 204/192.32, 192.33, 192.35, 298.31, 298.32; 118/712, 724; 356/357, 381, 382

[56] References Cited

U.S. PATENT DOCUMENTS

| | | | |
|---|---|---|---|
| 4,039,370 | 8/1977 | Kleinknecht | 156/626 |
| 4,141,780 | 2/1979 | Kleinknecht et al. | 156/626 |
| 4,303,341 | 12/1981 | Kleinknecht | 356/384 |
| 4,330,213 | 5/1982 | Kleinknecht | 356/355 |
| 4,340,461 | 7/1982 | Hendricks | 204/298 |
| 4,408,884 | 10/1983 | Kleinknecht | 356/355 |
| 4,439,261 | 3/1984 | Pavone | 156/345 |
| 4,457,359 | 7/1984 | Holden | 165/80 |
| 4,508,161 | 4/1985 | Holden | 165/1 |
| 4,512,391 | 4/1985 | Harra | 165/48 |
| 4,565,601 | 1/1986 | Kakehi et al. | 156/643 |
| 4,595,484 | 6/1986 | Giammario | 204/298 |
| 4,680,061 | 7/1987 | Lamont, Jr. | 148/115 |
| 4,713,140 | 12/1987 | Tien | 156/626 |
| 4,743,570 | 5/1988 | Lamont, Jr. | 437/248 |
| 4,886,571 | 12/1989 | Suzuki et al. | 156/646 |
| 4,911,812 | 3/1990 | Kudo et al. | 204/192.32 |
| 4,956,043 | 9/1990 | Kanetomo et al. | 156/345 |

FOREIGN PATENT DOCUMENTS 0258698 10/1988 European Pat. Off. .
0301335 5/1989 European Pat. Off. .

Primary Examiner—William A. Powell
Attorney, Agent, or Firm—G. E. Books

[57] ABSTRACT

Reactive ion plasma etching apparatus and method are based upon the discovery of enhanced uniformity of etching at low workpiece temperatures. With cooling to sufficiently low temperatures, spontaneous etching is inhibited and etching uniformity is controlled not by gas flow and pressure but rather by ion flux. As a result, one can eliminate uniformity enhancing apparatus which heretofore obstructed optical access to the workpiece, provide window means permitting optical access to a major portion of the workpiece and employ sophisticated optical monitoring techniques during the etching process.

10 Claims, 3 Drawing Sheets

PLASMA ETCHING APPARATUS AND METHOD

BACKGROUND OF THE INVENTION

The present invention relates to plasma etching apparatus and method and, more particularly, to apparatus and method for providing highly uniform etching of a semiconductor workpiece while permitting enhanced optical access to the workpiece for process monitoring and control.

Plasma etching has become important in the manufacture of semiconductor devices such as integrated circuits. Plasma etching is the selective removal of material from a workpiece by reactive chemical species generated within a glow discharge ambient. In many applications, plasma etching is superior to wet etching with regard to ease of operation, cleanliness and process control.

A typical plasma etching process involves loading one or more workpieces (typically semiconductor wafers) into a chamber, sealing the chamber and evacuating it to a low pressure in the range from about 0.2 Torr to about 5 Torr. A selected reagent gas is introduced into the chamber and is ionized by an applied radio frequency (RF) field. The resulting glow discharge contains equal numbers of positive and negative ions and a population of free radicals which are electrically neutral, highly reactive chemical species capable of etching semiconductor materials. Upon completion of the etching cycle, the reagent gas flow is terminated and the RF generator turned off. After the chamber is exhausted of reaction products, it is back-filled with inert gas, such as nitrogen. The chamber is then opened, and the workpieces are removed.

In reactive ion etching, termed RIE, plasma etching is enhanced by attracting ions from the plasma onto the workpiece. RIE etching is typically conducted at a pressure in the range between $2 \times 10^{-4}$ Torr and 0.2 Torr. Through one of a variety of postulated mechanisms, the colliding ions enhance the etch rate and impart direction to the etching process. Thus while unassisted plasma etching is isotropic, reactive ion etching proceeds primarily in the direction of the impinging ions. The advantage of RIE is that it etches relatively straight walls of uniform cross section as distinguished from the undercut walls typically produced by isotropic plasma etching.

One practical difficulty with reactive ion etching is non-uniform etching both on a macroscale from one end of the workpiece to the other and on a microscale in the vicinity of fine features. Efforts at minimizing macroscale nonuniformity have concentrated primarily on generating a uniform plasma and a uniform gas flow in the vicinity of the workpiece. The problem of nonuniformity on a microscale has not heretofore been adequately addressed.

Increasingly sophisticated techniques have been proposed for optically inspecting etched workpieces and even optically monitoring the workpieces during the etching process. However the practical utility of such optical monitoring processes has been limited by the presence of structures heretofore needed to enhance etching uniformity but which have the disadvantage of blocking optical access to the workpiece.

For example, a typical reactive ion etching apparatus for commercial use is described in U.S. Pat. No. 4,595,484 to N. J. Giammarco, et al. The apparatus comprises a process chamber, a cathode upon which the workpiece is mounted, and a three-plate anode arranged over the cathode. The anode plates are perforated to enhance uniformity of gas flow, plasma and etching on the underlying workpiece. While this anode arrangement is directed to improving uniformity on a macroscale, it does so at the cost of blocking optical access to the workpiece. Three layers of perforated metal over the workpiece foreclose optical techniques for monitoring and controlling the etching process.

SUMMARY OF THE INVENTION

The present applicants have discovered that in a reactive ion etching process, uniformity on both a macroscale and a microscale can be enhanced by maintaining the workpiece at a sufficiently low temperature during the etching process. This discovery permits the elimination of uniformity-enhancing structures overlying and surrounding the workpiece and permits optical access to workpiece for control and monitoring during the etching process.

In accordance with the invention, reactive ion etching apparatus comprises a vessel, an electrode for mounting a workpiece within the vessel, a cooling arrangement for cooling the workpiece, and plasma generation means laterally displaced with respect to the workpiece for creating a plasma overlying the workpiece. An optical window having a lateral dimension preferably in excess of the workpiece lateral dimension is disposed in the vessel wall overlying the workpiece. One or more optical systems can be mounted and oriented outside the vessel to optically monitor the wafer and the plasma through the window during processing.

The method for reactively ion etching a workpiece in accordance with the invention comprises the steps of disposing the workpiece on an electrode within a sealed vessel, evacuating the vessel to a low pressure, forming a reactive plasma overlying the surface of the workpiece to be etched, and cooling the workpiece to a sufficiently low temperature that etching reactants are adsorbed on the surface with little etching of the surface. Ions from the plasma are then induced to bombard the surface whereby etching proceeds substantially confined to the regions of the surface locally activated by the bombardment.

BRIEF DESCRIPTION OF THE DRAWINGS

The advantages, nature and various additional features of the invention will appear more fully upon consideration of the illustrative embodiments now to be described in detail in connection with the accompanying drawings, in which.

It is to be understood that these drawings are for purposes of illustrating the concepts of the invention and are not to scale.

Figure 1:
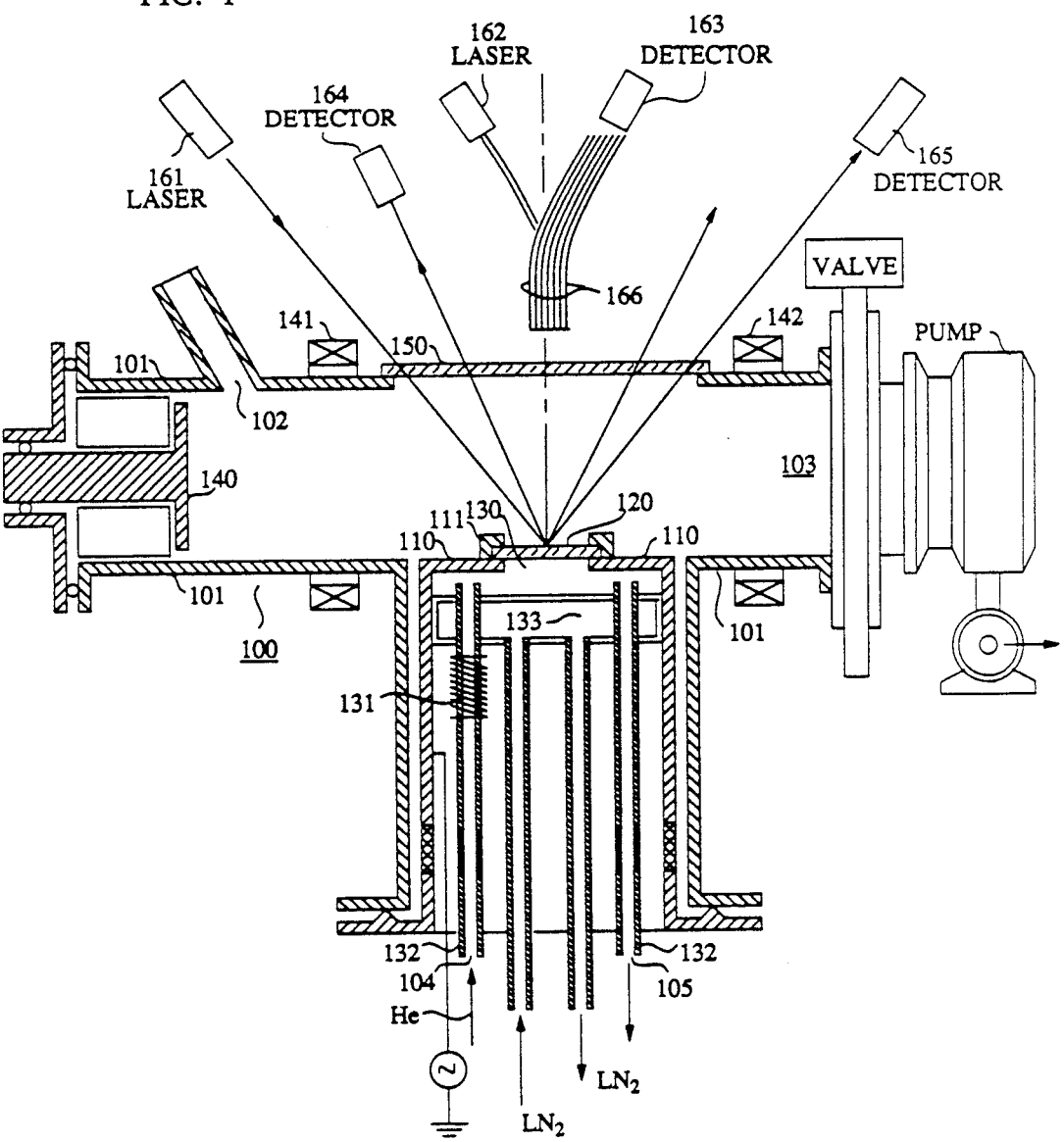
FIG. 1 is a schematic cross section of reactive ion etching apparatus in accordance with the invention.

Referring to the drawings, FIG. 1 illustrates in schematic cross section a reactive ion etching apparatus in accordance with one embodiment of the invention. In essence, the apparatus comprises a low pressure vessel 100, an electrode arrangement 110 for mounting a workpiece 120 within the vessel, a cooling arrangement 130, plasma generation means 140 laterally displaced with respect to the workpiece for generating a plasma (not shown) over the workpiece, and disposed within the vessel wall overlying the workpiece, an optical window 150. Optical monitoring and control systems in the forms of one or more optical light sources 161, 162 and one or more optical receivers 163, 164 and 165 can be mounted outside the vessel window in order to optically monitor the workpiece during processing.

The low pressure vessel 100 comprises all vessel walls 101 and windows, including window 150. The walls 101 are preferably one-eighth inch stainless steel and the optical windows are preferably one-fourth inch fused silica. Aperture 102 is provided for introducing a flow of reagent gas, and a valve-controlled aperture 103 is provided for pumping out gaseous reaction products. In addition, apertures 104 and 105 provide means for entrance and exit of chilled gas to cool workpiece 120. All seals between different components of the vessel are chosen in accordance with principles well-known in the art to permit evacuation of the vessel to low pressures on the order of a few Torr or less.

Figure 2:
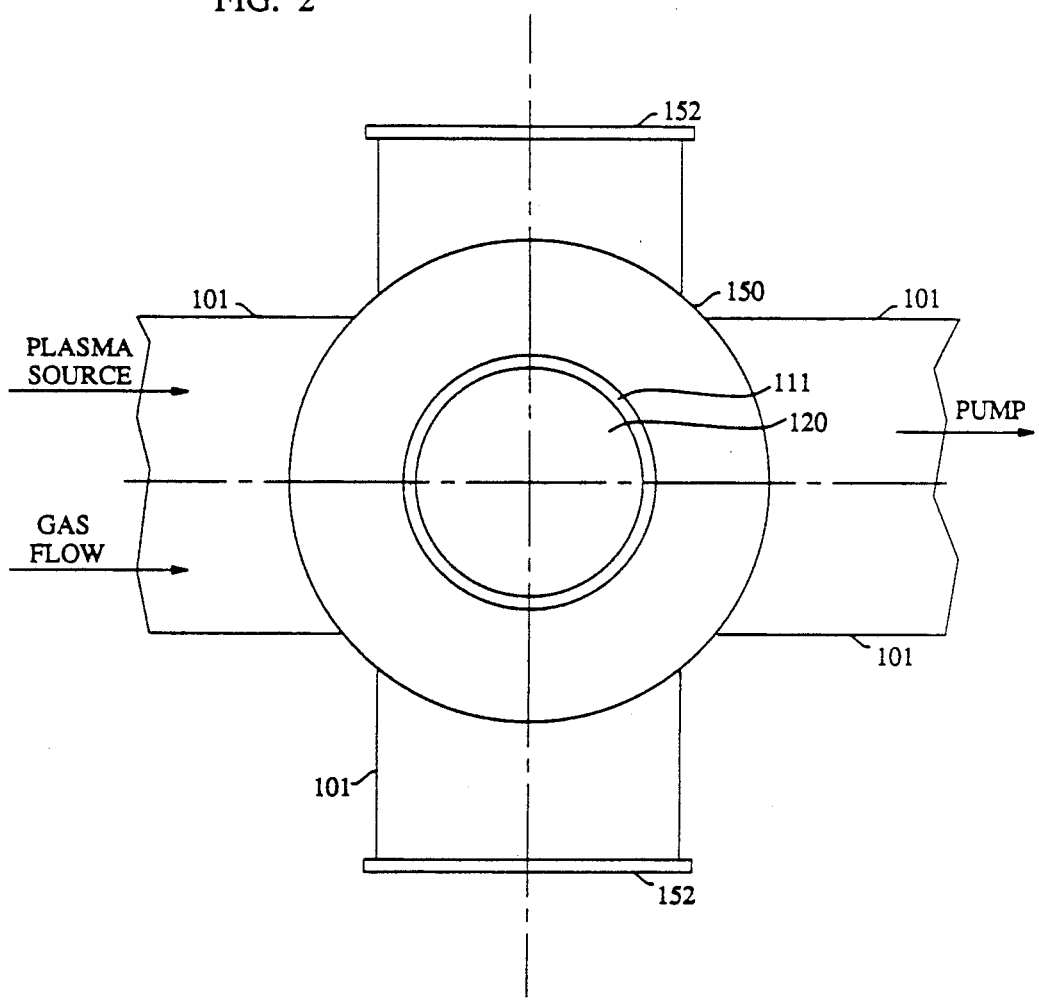
FIG. 2 is a schematic top view of the apparatus of FIG. 1.

The preferred structure of the low pressure vessel 100 can be better seen by reference to FIG. 2 which is a schematic view in elevation showing the optical window 150 in relation to the vessel walls 101 and the workpiece 120. As illustrated, with the window 150 larger than the workpiece 120 there is full optical access to workpiece through the window. To permit analysis of wide angle optical scattering and observation by multiple optical systems, the window should be larger than about one inch in diameter. Additional windows 151 and 152, one of which is removable, can be provided at either side of the workpiece.

Figure 3:
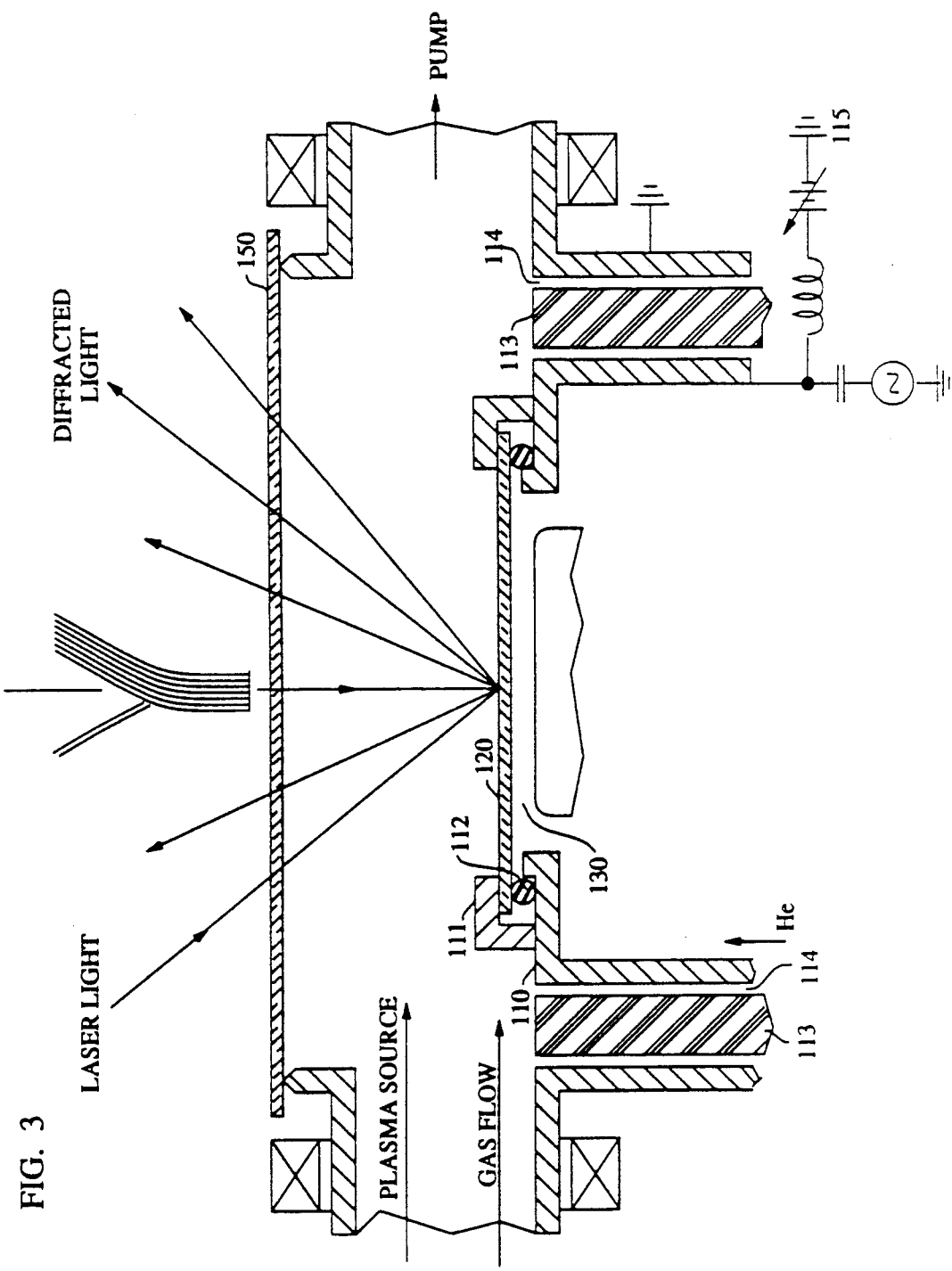
FIG. 3 is a schematic cross section showing the central portion of the apparatus of FIG. 1 in greater detail.

Referring to FIG. 3, which shows the central portion of the FIG. 1 apparatus in greater detail, the workpiece 120 is typically a circular wafer of semiconductor material such as gallium arsenide. The workpiece is preferably mounted on a hollow cylindrical electrode 110 by a circular clamp 111 such as a conventional electrostatic chuck and sealed in relation to the hollow interior of the electrode by an O-ring seal 112. The electrode 110 is electrically insulated from the walls 101 of the vessel by a surrounding cylinder of ceramic insulator 113 and/or spacing gaps 114. The electrode 110 is electrically connected to an RF power source 115 having a variable DC bias. In a preferred embodiment, electrode 110 is stainless steel, clamp 111 is oxidized aluminum, and the O-ring is a fluorocarbon rubber such as DuPont Viton.

Referring back to FIG. 1 cooling arrangement 130 for cooling workpiece 120 comprises a source of chilled gas (not shown), temperature control means such as a thermostatically controlled heating coil 131 in combination with a liquid nitrogen reservoir 133 for controlling the temperature of the gas and conduits 132 for permitting a flow of the chilled, temperature-controlled gas from the source to thermal contact with the workpiece at 130 and thereafter out. In typical practice the gas is helium introduced into contact with the workpiece at a controllable temperature of between 10° C. to −150° C. and at a pressure of about 4 Torr.

Plasma generation means 140 is laterally displaced with respect to workpiece 120 so that optical access to the workpiece through window 150 is unobstructed. The plasma generator 140 can be any one of a variety of plasma generating means known in the art such as a water-cooled RF electrode. Reagent gas flowing through aperture 102 is ionized by plasma generator 140, and the resulting plasma can be configured by magnetic fields from electromagnetic coils 141 and 142. As a result the glow discharge region of the plasma (not shown) extends over the workpiece 120, effectively forming an equipotential region and source of ions and reactive species over the workpiece. The reagent gas is preferably introduced on the plasma generator side of the workpiece and gaseous reaction products are removed on the other side through valve-controlled aperture 103 by a pump. A reagent gas for etching gallium arsenide workpieces can be a mixture of $BCl_3$ and $Cl_2$.

An important advantage of this apparatus is that with unobstructed optical access to the workpiece, one or more of a wide variety of optical techniques can be used to monitor the workpiece and/or the overlying plasma at multiple regions, preferably representative of the entire workpiece. Moreover with unobstructed access, techniques such as wide angle scattering can be employed. Typical optical monitoring systems comprise one or more optical sources 161 and 162 for directing optical energy onto the workpiece 120 and one or more optical detectors 163, 164 and 165 for receiving light from the workpiece or plasma. Preferred optical sources are lasers for emitting monochromatic light having a frequency greater than the bandgap frequency of the workpiece semiconductor. Preferred optical detectors are monochromators and silicon detectors. The optical monitoring systems can be based on measurements of diffraction, photoluminescence, polarization ratio, optical interference or spectral features of plasma induced emission.

In one preferred arrangement for monitoring the etching process using diffracted light, a movable photodetector 164 can be oriented and disposed for receiving light from laser 161 diffracted from the workpiece. Diffracted light of different orders provides information concerning line width, line depth and line edge profiles. See, for example, U.S. Pat. Nos. 4,408,884 and 4,039,370 for details concerning optical determination of these workpiece parameters.

In another preferred arrangement for monitoring the etching process using photoluminescence, light source 162 can be coupled to the wafer by one branch of a bifurcated fiber bundle 166 and photoluminescent light from the wafer can be coupled by the other branch of bundle 166 to a monochromator 163. Photoluminescent light provides information concerning temperature, etching rate, uniformity and etching endpoint. See, for example, co-pending U.S. patent application, Ser. No. 07/402,030 filed Sept. 1, 1989 by Richard A. Gottscho for details concerning determination of workpiece parameters from photoluminescence. In particular, the wavelength of peak intensity photoluminescent light shifts to longer wavelengths in proportion to the temperature of the workpiece. In this arrangement, light source 162 for a gallium arsenide workpiece preferably has a wavelength shorter than about 8680 angstroms, and can be a pulsed $N_2$ pumped dye laser emitting at a wavelength of 5040 angstroms.

Detector 165 can be oriented and disposed for receiving wide angle diffracted or scattered light from workpiece 120. Such wide angle scattered light provides information concerning uniformity of etching. Other optical monitoring techniques for endpoint detection are described in U.S. Pat. No. 4,377,436 issued to Vincent M. Donelly et al.

In use of the apparatus illustrated, the vessel 100 is loaded with a workpiece by opening one of the removable windows and clamping the workpiece on the electrode 110 as shown in FIG. 1. The vessel is then sealed and evacuated to a low pressure on the order of about 5 to 50 milliTorr. Cooling arrangement 130 is then activated by introducing helium gas through conduit 132 into thermal contact with the back of the workpiece.

When the wafer reaches a desired low temperature, reagent gas is introduced through aperture 102 and plasma generator 140 is activated by applying RF power to electrode 140 while maintaining the metal walls of the vessel at ground. RF excitation of the reagent gas produces a plasma which is configured above workpiece 120 by electromagnets 141 and 142. At the same time RF power with a controllable DC bias is applied to the electrode 110 for attracting ions from the plasma onto the workpiece 120. Gaseous reaction products and excess reagent gas are continuously pumped out of the vessel through valve-controlled aperture 103.

The combination of ion bombardment and reactive chemical species from the plasma anisotropically etch the unmasked portions of the workpiece. The depth and uniformity of the etching are monitored by the degree to which light from laser 161 is scattered by the wafer surface.

When the desired etching is achieved, the flow of reagent and cooling gas is terminated, the RF power is turned off, and the vessel is exhausted of reaction products. The vessel is then backfilled with nitrogen, and the etched workpiece removed.

Multilayer workpieces consisting of alternating layers of AlGaAs and AlAs etched in accordance with this process possess enhanced uniformity of etching depth both on a macroscale and on a microscale. Experiments by the present applicants show that etching at $-40°$ C. enhances uniformity as compared with etching at $27°$ C. with relatively little reduction in etching rate. At $27°$ C., the difference in etched depths between features close together (one micron spacing) and features far apart (10 micron spacing) was 1500-2000 angstroms for an average etch depth of 8500 angstroms. This corresponded to a microscopic nonuniformity of 18-24%. In contrast, at a temperature of $-40°$ C., the etched depths differed by less than 1000 angstroms across an entire wafer. The observed microscopic nonuniformity was less than about 3%. The observed etching rate of 0.40 microns per minute at $-40°$ C. was comparable to the observed rate of 0.65 microns per minute at $27°$ C.

Applicants propose the following theory for enhanced uniformity at lowered temperatures. At higher temperatures, even at low pressures, etching of areas in the vicinity of fine features (high aspect-ratio features) is limited by the transport of reactive species into these areas. Closely spaced elevated regions of the substrate surface may effectively block transport of reactive species to nearby valley areas, effectively reducing the local etch rate and producing nonuniformity. However if the substrate is cooled to sufficiently reduce the rate of chemical reaction, transport of reactant will no longer control the etch rate. Rather spontaneous etching will be inhibited, and reactant will be adsorbed on the wafer surface. Etch occurs predominantly where the surface is locally activated by ion bombardment. Since the reactant need not be supplied from the gas, etching uniformity is controlled not by gas flow and pressure but rather by ion flux which is naturally uniform at a planar surface in contact with a plasma.

The observed enhancement of uniformity at lowered temperatures makes possible the elimination of a variety of uniformity-enhancing arrangements which have heretofore obstructed optical access to the workpiece during the etching process. This uniformity permits optical access to the etching surface through windows larger than one inch and larger than the workpiece. Such windows greatly facilitate real-time optical monitoring of the workpiece during etching.

From the foregoing it should be observed that the subject apparatus and method for RIE etching possess a number of important advantages:

(1) Optical access to the workpiece, especially from the top, is greatly enhanced;

(2) The workpiece temperature can be continuously monitored by using a bifurcated fiber arrangement for monitoring photoluminescence from the surface being etched;

(3) Prior monitoring and inspecting techniques based on first order diffracted light can now be extended to multiple orders and can be employed in real time monitoring of the etching process as it progresses.

(4) Enhanced uniformity of etching permits the etching of features on the workpiece down to the same depth independent of the distance between adjacent features and independent of the diameter of etched holes.

(5) Control of the energy of ions impinging onto the wafer surface is effected by the DC and RF bias applied to the cathode. This control is independent of the voltages needed to generate the plasma.

(6) Freedom to vary both the ion energy and the workpiece temperature permits the user to optimize the angle of cutting.

It is to be understood that the above described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. Reactive ion etching apparatus comprising:
a vessel;
an electrode for mounting a workpiece to be etched within said vessel;
cooling means for cooling said workpiece mounted within said vessel;
plasma generation means laterally displaced with respect to said mounted workpiece for creating a plasma overlying said workpiece,
means for attracting ions from said plasma onto said workpiece; and
optical window means having a lateral dimension in excess of about one inch disposed in a wall of said vessel overlying said workpiece for providing optical access to said workpiece during etching.

2. Reactive ion etching apparatus according to claim 1 further comprising:
a source of light;
means for directing light from said source onto a region of said workpiece; and
means for detecting light from said region of said workpiece.

3. Reactive ion etching apparatus according to claim 1 wherein:
said vessel comprises metal walls, and
said plasma generating means comprises electrode means and an RF power supply for establishing an RF field between said electrode and said metal walls.

4. Reactive ion etching apparatus according to claim 2 wherein said electrode means comprises means for electrostatically clamping said workpiece on said electrode.

5. Reactive ion etching apparatus according to claim 2 wherein said means for attracting ions comprises means for applying to said electrode a voltage for attracting ions from a plasma onto said workpiece.

6. Reactive ion etching apparatus according to claim 2 wherein said cooling means comprises means for providing a flow of chilled gas in thermal contact with the side of said workpiece opposite the side to be etched.

7. Apparatus according to claim 2 wherein said optical window means has lateral dimension in excess of the lateral dimension of said workpiece.

8. Apparatus according to claim 2 wherein said light source is disposed outside said vessel and oriented to direct light through said window onto said workpiece and said means for detecting light is disposed outside said workpiece and is oriented for receiving light from said workpiece through said window.

9. A method for reactively ion etching a workpiece comprising the steps of:
  disposing the workpiece on an electrode within a sealed vessel;
  evacuating the vessel to a low pressure in the range between $10^{-4}$ Torr and 10 Torr;
  forming a reactive plasma overlying the surface of said workpiece to be etched;
  cooling said workpiece to a sufficiently low temperature that etching reactants are adsorbed on said surface to be etched; and
  inducing bombardment of ions from said plasma onto said surface to be etched whereby etching is effected at and substantially confined to regions of the workpiece locally activated by ion bombardment.

10. A method according to claim 9 wherein:
said plasma is formed over the surface of the workpiece without obstructing optical access to the surface; and
further comprising the step of optically monitoring the etching of said workpiece through an optical window in said vessel overlying said workpiece.

* * * * *